United States Patent
Lin

(10) Patent No.: US 8,946,707 B2
(45) Date of Patent: *Feb. 3, 2015

(54) TUNNELING MAGNETORESISTANCE (TMR) READ SENSOR WITH AN INTEGRATED AUXILLIARY FERROMAGNETIC SHIELD

(71) Applicant: HGST Netherlands B.V., Amsterdam (NL)

(72) Inventor: Tsann Lin, Saratoga, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/754,685

(22) Filed: Jan. 30, 2013

(65) Prior Publication Data

US 2014/0210024 A1   Jul. 31, 2014

(51) Int. Cl.
*H01L 21/48*   (2006.01)
*H01L 43/02*   (2006.01)
*H01L 43/12*   (2006.01)

(52) U.S. Cl.
CPC ............. *H01L 43/02* (2013.01); *H01L 43/12* (2013.01)
USPC ........................................................ 257/52

(58) Field of Classification Search
CPC ......... H01L 43/08; H01L 43/10; H01L 43/12; G11B 5/33; G11B 5/35; G11B 5/39; G11B 5/127; G11B 5/3912; G11B 5/3923
USPC ........................................................ 257/52
See application file for complete search history.

(56) References Cited

U.S. PATENT DOCUMENTS

| 6,856,493 | B2 | 2/2005 | Pinarbasi |
| 7,268,979 | B2 * | 9/2007 | Gill .......................... 360/324.11 |
| 7,420,886 | B2 | 9/2008 | Tomiyasu et al. |
| 7,466,524 | B2 | 12/2008 | Freitag et al. |

(Continued)

FOREIGN PATENT DOCUMENTS

JP   2006/139861 A   6/2006

OTHER PUBLICATIONS

Lin et al., "Effects of oxide seed and cap layers on magnetic properties of a synthetic spin valve," 2001 American Institute of Physics, Applied Physics Letters, vol. 78, No. 15, Apr. 9, 2001, pp. 2181-2183.

*Primary Examiner* — Michael Lebentritt
(74) *Attorney, Agent, or Firm* — Zilka-Kotab, PC

(57) ABSTRACT

The invention provides a tunneling magnetoresistance (TMR) read sensor with an integrated auxiliary shield comprising buffer, parallel-coupling, shielding and decoupling layers for high-resolution magnetic recording. The buffer layer, preferably formed of an amorphous ferromagnetic Co—X (where X is Hf, Y, Zr, etc.) film, creates microstructural discontinuity between a lower ferromagnetic shield and the TMR read sensor. The parallel-coupling layer, preferably formed of a polycrystalline nonmagnetic Ru film, causes parallel coupling between the buffer and shielding layers. The shielding layer, preferably formed of a polycrystalline ferromagnetic Ni—Fe film exactly identical to that used as the lower ferromagnetic shield, shields magnetic fluxes stemming from a recording medium into the lower edge of the TMR read sensor. The decoupling layer, preferably formed of another polycrystalline nonmagnetic Ru film, causes decoupling between the shielding layer and a pinning layer preferably formed of a polycrystalline antiferromagnetic Ir—Mn film.

16 Claims, 14 Drawing Sheets

(56) References Cited

U.S. PATENT DOCUMENTS

| | | | |
|---|---|---|---|
| 8,107,202 B2* | 1/2012 | Lee et al. | 360/324.2 |
| 8,164,862 B2 | 4/2012 | Zhang et al. | |
| 8,675,317 B2* | 3/2014 | Lin | 360/324.11 |
| 2005/0024789 A1* | 2/2005 | Lin et al. | 360/324 |
| 2005/0047027 A1* | 3/2005 | Lin | 360/324.1 |
| 2009/0161268 A1 | 6/2009 | Lin | |
| 2009/0244791 A1* | 10/2009 | Lin | 360/324.2 |
| 2010/0309580 A1 | 12/2010 | Tonooka et al. | |
| 2012/0069471 A1 | 3/2012 | Lin | |
| 2012/0164485 A1* | 6/2012 | Lin | 428/811.3 |
| 2013/0164562 A1* | 6/2013 | Lin | 428/811.1 |

* cited by examiner

TUNNELING MAGNETORESISTANCE (TMR) READ SENSOR WITH AN INTEGRATED AUXILLIARY FERROMAGNETIC SHIELD

FIELD OF THE INVENTION

The invention relates to non-volatile magnetic storage devices and more particularly to a magnetic disk drive including a tunneling magnetoresistance (TMR) read sensor with an integrated auxiliary ferromagnetic shield for high-resolution magnetic recording.

BACKGROUND OF THE INVENTION

One of many extensively used non-volatile magnetic storage devices is a magnetic disk drive that includes a rotatable magnetic disk and an assembly of write and read heads. The assembly of write and read heads is supported by a slider that is mounted on a suspension arm. The suspension arm is supported by an actuator that can swing the suspension arm to place the slider with its air bearing surface (ABS) over the surface of the magnetic disk.

When the magnetic disk rotates, an air flow generated by the rotation of the magnetic disk causes the slider to fly on a cushion of air at a very low elevation (fly height) over the magnetic disk. When the slider rides on the air, the actuator moves the suspension arm to position the assembly of write and read heads over selected data tracks on the magnetic disk. The write and read heads write and read data in the selected data tracks, respectively. Processing circuitry connected to the write and read heads then operates according to a computer program to implement writing and reading functions, respectively.

The write head includes a magnetic write pole and a magnetic return pole that are magnetically connected with each other at a region away from the ABS, and an electrically conductive write coil surrounding the write head. In a writing process, the electrically conductive write coil induces magnetic fluxes in the write head. The magnetic fluxes form a magnetic write field emitting from the magnetic write pole to the magnetic disk in a direction perpendicular to the surface of the magnetic disk. The magnetic write field writes data in the selected data tracks, and then returns to the magnetic return pole so that it will not erase previously written data in adjacent data tracks.

The read head includes a read sensor that is electrically connected with lower and upper ferromagnetic shields, but is electrically separated by insulation layers from longitudinal bias layers in two side regions. In a reading process, the read head passes over data in a selected data track, and magnetic fields emitting from the data modulate the resistance of the read sensor. A change in the resistance of the read sensor is detected by a sense current passing through the read sensor, and is then converted into a voltage change that generates a read signal. The resulting read signal is used to decode data in the selected data track.

A current-perpendicular-to-plane (CPP) tunneling magnetoresistance (TMR) read sensor is typically used in the read head. The CPP TMR read sensor includes a nonmagnetic insulating barrier layer sandwiched between a ferromagnetic reference layer and a ferromagnetic sense layer. The thickness of the barrier layer is chosen to be less than the mean free path of conduction electrons passing through the CPP TMR read sensor. The magnetization of the reference layer is pinned in a direction perpendicular to the ABS, while the magnetization of the sense layer is oriented in a direction parallel to the ABS. When passing the sense current through the CPP TMR read sensor, the conduction electrons are scattered at lower and upper interfaces of the barrier layer. When receiving a magnetic field emitting from data in the selected data track, the magnetization of the reference layer remains pinned while that of the sense layer rotates. Scattering decreases as the magnetization of the sense layer rotates towards that of the reference layer, or increases as the magnetization of the sense layer rotates away from that of the reference layer. This scattering variation induces a tunneling effect characterized by a change in the resistance of the CPP TMR read sensor in proportion to the magnitude of the magnetic field and cos θ, where θ is an angle between the magnetizations of the reference and sense layers. The change in the resistance of the CPP TMR read sensor is then detected by the sense current and converted into a voltage change that is processed as a read signal.

The CPP TMR read sensor has been progressively miniaturized for magnetic recording at higher linear and track densities. Its thickness, which defines a read gap, is reduced by utilizing thinner reference, barrier, sense or other layers, in order to increase linear densities. Its width, which defines a track width, is reduced by patterning with an advanced photolithographic tool, in order to increase track densities.

SUMMARY OF THE INVENTION

The invention provides a tunneling magnetoresistance (TMR) read sensor with an integrated auxiliary shield comprising buffer, parallel-coupling, shielding and decoupling layers for high-resolution magnetic recording. The buffer layer, preferably formed of an amorphous ferromagnetic Co—X (where X is Hf, Y, Zr, etc.) film, creates microstructural discontinuity between a lower ferromagnetic shield and the TMR read sensor. The parallel-coupling layer, preferably formed of a polycrystalline nonmagnetic Ru film, causes parallel coupling between the buffer and shielding layers. The shielding layer, preferably formed of a polycrystalline ferromagnetic Ni—Fe film exactly identical to that used as the lower ferromagnetic shield, shields magnetic fluxes stemming from a recording medium into the lower edge of the TMR read sensor. The decoupling layer, preferably formed of another polycrystalline nonmagnetic Ru film, causes decoupling between the shielding layer and a pinning layer preferably formed of a polycrystalline antiferromagnetic Ir—Mn film. The parallel coupling across the parallel-coupling layer and between the buffer and shielding layers facilitates the buffer, parallel-coupling and shielding layers to form an integrated auxiliary ferromagnetic shield, and thus facilitates the lower ferromagnetic shield to extend ferromagnetic continuity to the upper surface of the shielding layer. The decoupling between the shielding and pinning layers facilitates the shielding layer to shield effectively and the TMR read sensor to operate quietly. To minimize surface roughness and improve thermal properties, the buffer, parallel-coupling, shielding, decoupling and pinning layers are all deposited at high temperatures in one deposition module of a sputtering system.

These and other features and advantages of the invention will be apparent upon reading of the following detailed description of preferred embodiments taken in conjunction with the figures in which like reference numerals indicate like elements throughout.

BRIEF DESCRIPTION OF THE DRAWINGS

For a fuller understanding of the nature and advantages of the invention, as well as the preferred mode of use, reference should be made to the following detailed description read in conjunction with the accompanying drawings which are not to scale.

Table 1 is a table listing $H_F$, $H_{SF}$, $R_JA_J$, $\Delta R_T/R_J$, FoM and $T_T$ for TMR read sensors 201, 301, 401.

Table 2 is a table listing $H_F$, $H_{SF}$, $R_JA_J$, $\Delta R_T/R_J$, FoM and $T_T$ for various TMR read sensors 401 with Ni—Fe shielding layers, Ru decoupling layers and Ir—Mn pinning layers of various thicknesses.

DETAILED DESCRIPTION

The following description is of the preferred embodiment presently contemplated for carrying out the invention. This description is made for the purpose of illustrating general principles of the invention and is not meant to limit inventive concepts claimed herein.

Figure 1:
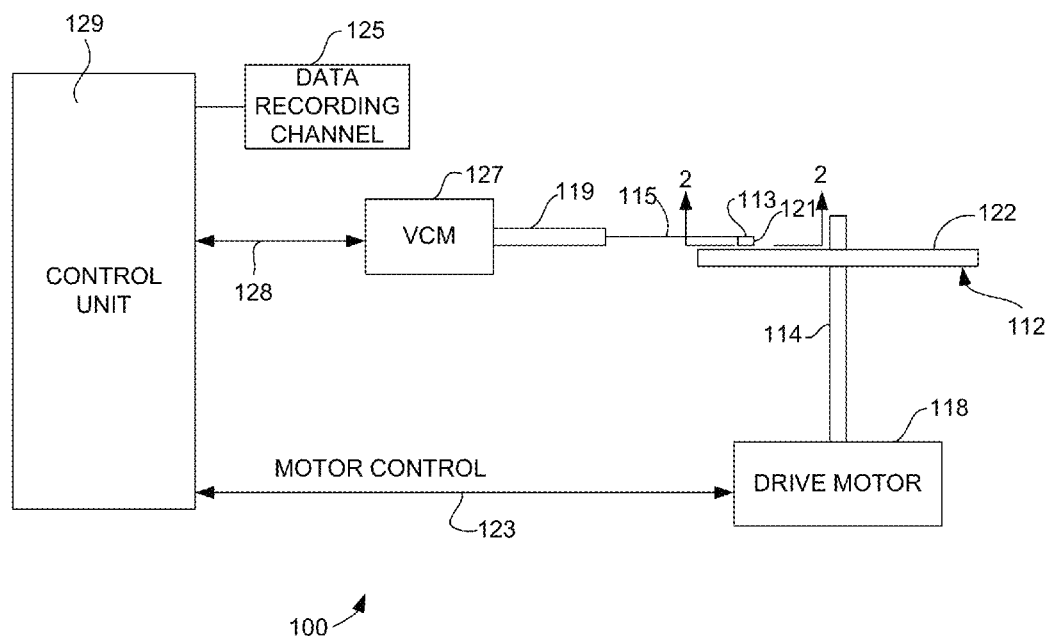
FIG. 1 is a schematic illustration of a magnetic disk drive in which the invention may be embodied.

Referring now to FIG. 1, there is shown a magnetic disk drive 100 embodying the invention. As shown in FIG. 1, at least one rotatable magnetic disk 112 is supported on a spindle 114 and rotated by a disk drive motor 118. Magnetic recording on each magnetic disk 112 is performed at annular patterns of data tracks (not shown) on the magnetic disk 112.

At least one slider 113 is positioned near the magnetic disk 112, each slider 113 supporting one assembly of write and read heads 121. As the magnetic disk 112 rotates, the slider 113 moves radially in and out over the disk surface 122 so that the assembly of write and read heads 121 may access different data tracks on the magnetic disk 112. Each slider 113 is mounted on a suspension arm 115 that is supported by an actuator 119. The suspension arm 115 provides a slight spring force which biases the slider 113 against the disk surface 122. Each actuator 119 is attached to an actuator means 127 that may be a voice coil motor (VCM). The VCM comprises a coil movable within a fixed magnetic field, the direction and speed of the coil movements being controlled by motor current signals supplied by a control unit 129.

During operation of the magnetic disk drive 100, the rotation of the magnetic disk 112 generates an air bearing between the slider 113 and the disk surface 122, which exerts an upward force or lift on the slider 113. The air bearing thus counter-balances the slight spring force of the suspension arm 115 and supports the slider 113 off and slightly above the disk surface 122 by a small, substantially constant spacing during sensor operation.

The various components of the magnetic disk drive 100 are controlled in operation by control signals generated by the control unit 129, such as access control and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position the slider 113 to the desired data track on the magnetic disk 112. Write and read signals are communicated to and from the assembly of write and read heads 121 by way of a recording channel 125.

Figure 2:
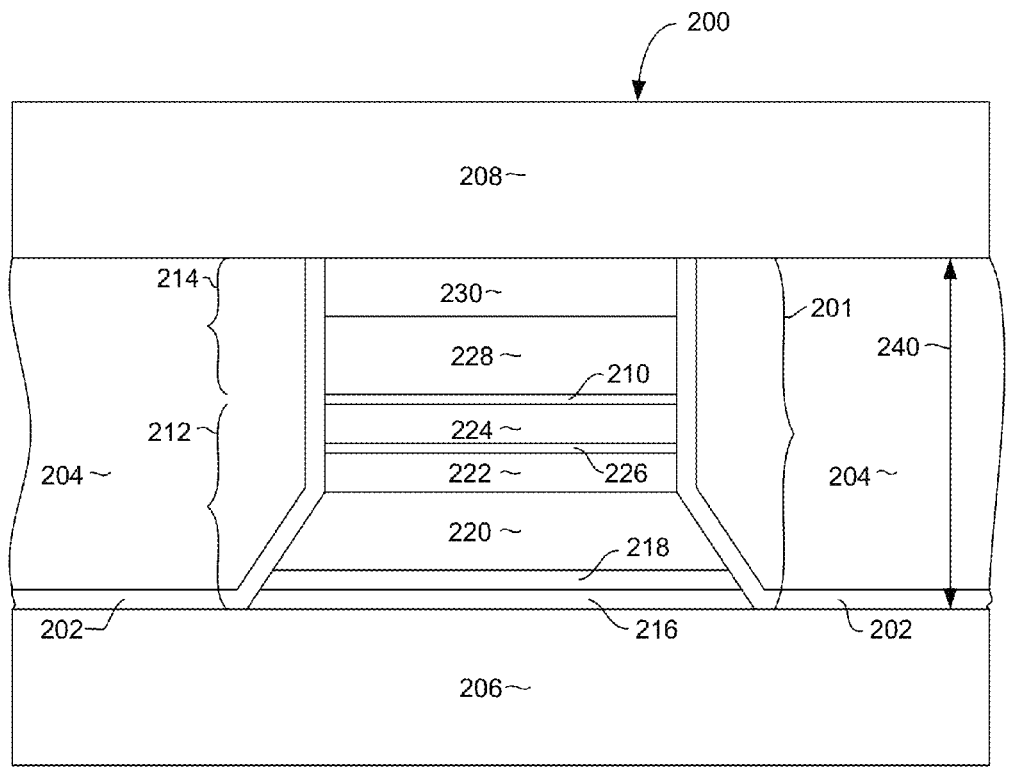
FIG. 2 is an ABS schematic view of a read head in accordance with the prior art.

FIG. 2 shows a read head 200 in accordance with the prior art, where a tunneling magnetoresistance (TMR) read sensor 201 is electrically connected with lower and upper ferromagnetic shields 206, 208 to allow a sense current to flow in a direction perpendicular to planes of the TMR read sensor 201, but is electrically insulated by insulation layers 202 from longitudinal bias stacks 204 in two side regions to prevent the sense current from shunting through the two side regions.

The TMR read sensor 201 includes an electrically insulating barrier layer 210 sandwiched between lower and upper sensor stacks 212, 214. The barrier layer 210 is formed of four identical laminates of 0.2 nm thick oxygen-doped Mg (Mg—O) films. Each laminate is fabricated as described below. A 0.2 nm thick Mg film is DC-sputtered in an argon gas of $3\times10^{-4}$ torr at a target power of 40 W, and then the Mg film is exposed in an oxygen gas of $1\times10^{-5}$ for 60 minutes. The oxygen exposure is optimized to ensure no residual Mg atoms and no oxygen penetration into the lower sensor stack 212.

The lower sensor stack 212 comprises a buffer layer 216 formed of a 2 nm thick nonmagnetic Ta film, a seed layer 218 formed of a 2 nm thick nonmagnetic Ru film, a pinning layer 220 formed of a 6 nm thick antiferromagnetic 23.2Ir-76.8Mn (composition in atomic percent) film, a keeper layer 222 formed of a 2 nm thick ferromagnetic 72.5Co-27.5Fe film, an antiparallel-coupling layer 226 formed of a 0.8 nm thick nonmagnetic Ru film, and a reference layer structure 224. The thickness of the keeper layer 222 is selected to exhibit a total saturation areal moment of 0.28 memu/cm² (corresponding to that of a 4 nm thick ferromagnetic 88Ni-12Fe film sandwiched between two Cu films). The reference layer structure 224 comprises a first reference layer formed of a 0.4 nm thick ferromagnetic Co film, a second reference layer formed of a 0.6 nm thick ferromagnetic 42.8Co-37.8Fe-13.2B-6.2Ta film, a third reference layer formed of a 0.6 nm thick ferromagnetic 65.5Co-19.9Fe-14.6B film, and a fourth reference layer formed of a 0.4 nm thick ferromagnetic 46.8Co-53.2 Fe film. The thicknesses of the first, second, third and fourth reference layers are selected for the reference layer structure 224 to exhibit a total saturation areal moment of 0.26 memu/ cm² (corresponding to that of a 3.7 nm thick ferromagnetic 88Ni-12Fe film sandwiched between two Cu films).

The upper sensor stack 214 comprises a sense layer structure 228 and a cap layer structure 230. The sense layer structure 228 comprises a first sense layer formed of a 0.6 nm thick ferromagnetic 46.8Co-53.2Fe film, a second sense layer formed of a 1.6 nm thick ferromagnetic 79.3Co-4.0Fe-16.7B film, a third sense layer formed of a 1.6 nm thick ferromagnetic 77.4Co-1.2Fe-6.7B-14.7Hf film, and a fourth sense layer formed of a 4.8 nm thick ferromagnetic Ni film. Thicknesses of the first, second, third and fourth sense layers are selected for the sense layer structure 228 to exhibit a total saturation areal moment of 0.56 memu/cm² (corresponding to that of an 8 nm thick ferromagnetic 88Ni-12Fe film sandwiched between two Cu films). The cap layer structure 230 comprises a first cap layer formed of a 1 nm thick nonmagnetic Ru film, a second cap layer formed of a 1 nm thick nonmagnetic Ta film, and a third cap layer formed of a 4 nm thick nonmagnetic Ru film.

A typical insulation layer 202 in each side region is formed of a 2 nm thick nonmagnetic, amorphous $Al_2O_3$ film. A typical longitudinal bias stack 204 in each side region comprises a seed layer formed of a 4 nm thick nonmagnetic Cr film, a longitudinal bias layer formed of a 25.6 nm thick hard-magnetic 82Co-18Pt film, and a cap layer formed of a 10 nm thick nonmagnetic Cr film. The thickness of the Co—Pt longitudinal bias layer is selected to attain a remnant areal moment of 2.24 memu/cm² (corresponding to that of a 32 nm thick ferromagnetic 88Ni-12Fe film sandwiched between two Cu films).

In the fabrication process of the read head 200, the TMR read sensor 201 is deposited on a wafer with a lower ferromagnetic shield 206 formed of a 1 μm thick ferromagnetic 80Ni-20Fe film in various deposition modules of a sputtering system, and is annealed with a magnetic field of 50,000 Oe for 5 hours at 280° C. in a high-vacuum oven. The TMR read sensor 201 is patterned in a photolithographic process to produce sensor front and rear edges, and then patterned again in another photolithographic process to produce sensor tails at the two side regions. The $Al_2O_3$ insulation layer 202 and the longitudinal bias stack 204 are then deposited into the two side regions. The photoresist is removed and a chemical-mechanical-polishing process is then conducted. The TMR read sensor 201, the $Al_2O_3$ insulation layer 202, and the longitudinal bias stack 204 are then covered by the upper ferromagnetic shield 208 also formed of a 1 μm thick ferromagnetic 80Ni-20Fe film, and by a gap formed of a 100 nm thick nonmagnetic $Al_2O_3$ film. After completing the read head fabrication process, the write head fabrication process starts.

The keeper layer 222, the antiparallel-coupling layer 226 and the reference layer structure 224 form a flux closure where four magnetic interactions occur. First, antiferromagnetic/ferromagnetic coupling occurs between the pinning layer 220 and the keeper layer structure 222, thus increasing the easy-axis coercivity ($H_{CE}$) of the keeper layer structure 222 and inducing a unidirectional anisotropy field ($H_{UA}$). Second, ferromagnetic/ferromagnetic coupling occurs across the antiparallel-coupling layer 226 and between the keeper layer structure 222 and the reference layer structure 224, thus inducing a bidirectional anisotropy field ($H_{BA}$). Third, ferromagnetic/ferromagnetic coupling also occurs across the barrier layer 210 and between the reference structure 224 and the sense layer structure 228, thus increasing the easy-axis coercivity ($H_C$) of the sense layer structure 228 and inducing a ferromagnetic-coupling field ($H_F$). Fourth, magnetostatic interaction occurs in the sense layer structure 228 due to stray fields that stem from the net magnetization of the keeper layer structure 222 and the reference layer structure 224, thus inducing a demagnetizing field ($H_D$). To ensure proper sensor operation, $H_{UA}$ and $H_{BA}$ must be high enough to rigidly pin the magnetizations of the keeper layer structure 222 and the reference layer structure 224 in opposite transverse directions perpendicular to the ABS, while $H_F$ and $H_D$ must be small and balance with each other to orient the magnetization of the sense layer structure 228 in a longitudinal direction parallel to the ABS.

When a sense current flows in a direction perpendicular to planes of the TMR read sensor 201, its areal resistance can be characterized by a product of junction resistance and area ($R_J A_J$). For a TMR read sensor 201 with $R_J A_J = 1$ Ω-μm², its $R_J$ will be 100Ω when its $A_J$ is 1,000 nm×1,000 nm, and will be 400Ω when $A_J$ is 500 nm×500 nm. It is thus desirable for the TMR read sensor 201 to exhibit a lower $R_J A_J$, so that its $R_J$ can be still below 400Ω when its $A_J$ is below 500 nm×500 nm after the sensor miniaturization process. When the sense current quantum jumps across the $MgO_X$ barrier layer 210 and a magnetic field rotates the magnetization of the sense layer structure 228 from the same direction as that of the reference layer structure 224 to an opposite direction, scattering of conduction electrons at lower and upper interfaces of the $MgO_X$ barrier layer 210 induces the TMR effect and causes an increase in the junction resistance from $R_J$ to $R_J + \Delta R_T$. The strength of this TMR effect can be characterized by $\Delta R_T/R_J$ defined as a TMR coefficient. It is also important for the TMR read sensor 201 with a lower $R_J A_J$ to still maintain a high $\Delta R_T/R_J$. The TMR read sensor 201 can thus exhibit a higher ratio of $\Delta R_T/R_J$ to $R_J A_J$, which is proportional to a signal amplitude and thus a figure of merit (FoM) of the signal amplitude.

Figure 3:
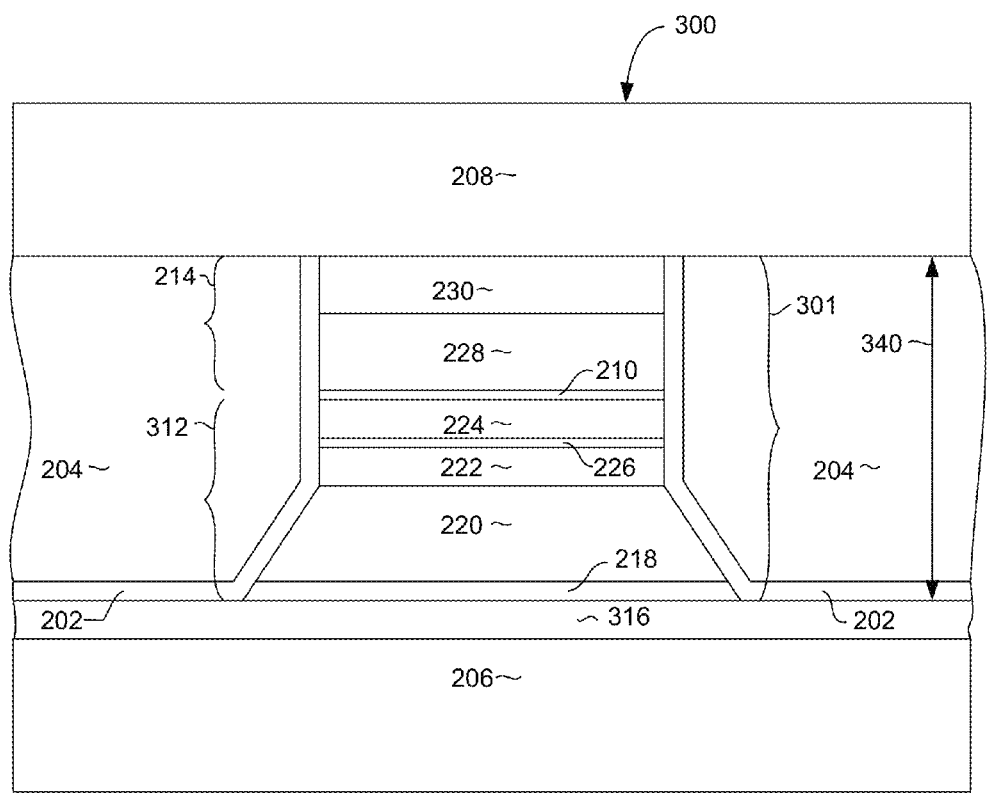
FIG. 3 is an ABS schematic view of another read in accordance with the prior art.

FIG. 3 shows another read head 300 in accordance with the prior art. The read head 300 is basically identical to the read head 200 except that the Ta buffer layer 216 is replaced by a buffer layer 316 formed of a 4 nm thick amorphous ferromagnetic 78.5Co-21.5Hf film. The Co—Hf buffer layer 316 is amorphous and thus discontinues the microstructures of the lower ferromagnetic shield 206 and the TMR read sensor 301. The Co—Hf buffer layer 316 is ferromagnetic and thus continues ferromagnetism of the lower ferromagnetic shield 206 to the lower surface of the Ru seed layer 218. With the incorporation of this auxiliary ferromagnetic shield 316, the read head 300 exhibits a read gap 340 smaller by 2 nm than the read gap 240.

Figure 4:
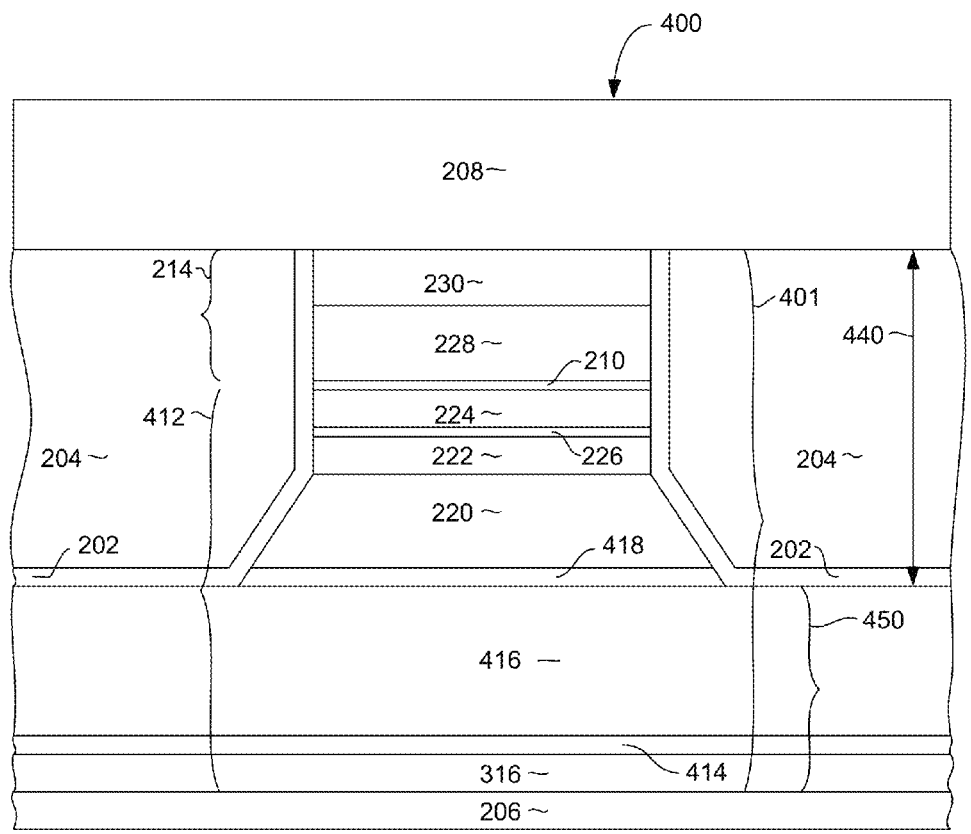
FIG. 4 is an ABS schematic view of a read head in accordance with an embodiment of the invention.

FIG. 4 shows a read head 400 in accordance with a preferred embodiment of the invention. The read head 400 is similar to the read head 300, except that the Ru seed layer 218 is replaced by a parallel coupling layer formed of a 1.2 nm thick nonmagnetic Ru film 414, a shielding layer formed of a 12 nm thick ferromagnetic 80Ni-20Fe film 416, and a decoupling layer formed of a 1.2 nm thick nonmagnetic Ru film 418. The read head 400 thus differs from the read head 300 in the formation of an integrated auxiliary ferromagnetic shield 450 comprising the Co—Hf buffer layer 316, the Ru parallel coupling layer 414, and the Ni—Fe shielding layer 416. With the integrated auxiliary ferromagnetic shield 450, the read head 400 exhibits several improvements needed for high-resolution magnetic recording, as described below.

Figure 5:
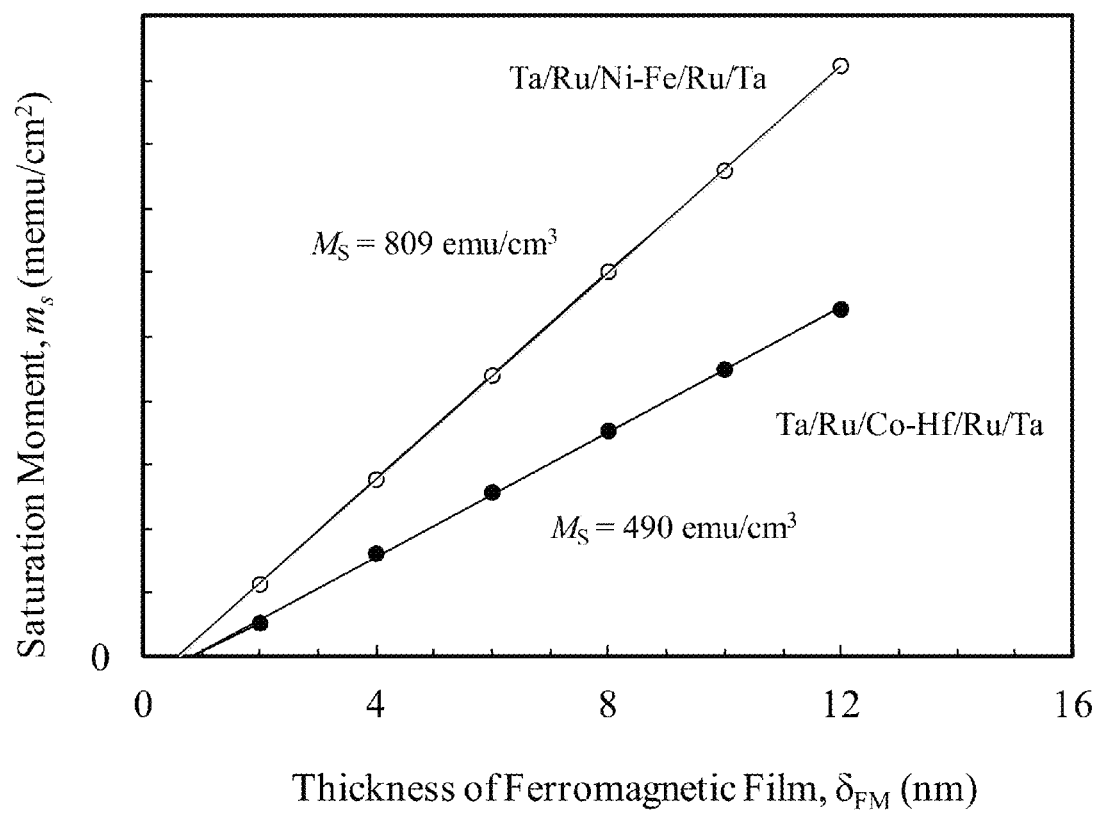
FIG. 5 is a chart showing the saturation moment ($m_S$) versus the thickness of the ferromagnetic film ($\delta_{FM}$) for Ta(2)/Ru(2)/Co—Hf/Ru(2)/Ta(2) and Ta(2)/Ru(2)/Ni—Fe/Ru(2)/Ta(2) films.

First, the incorporation of the Ni—Fe shielding layer 416 in the integrated auxiliary ferromagnetic shield 450 leads to a higher permeability and thus a more effective shielding effect. The permeability is inversely proportional to a uniaxial anisotropy field ($H_K$) but is proportional to a saturation magnetization ($M_S$). The Co—Hf buffer layer 316, exhibits $H_K$ ranging from 15 to 22 Oe over its thickness ranging from 4 to 20 nm, while the Ni—Fe shielding layer 416 exhibits $H_K$ ranging from 4 to 6 Oe over its thickness ranging from 4 to 20 nm. FIG. 5 shows the saturation moment ($m_S$) versus the thickness of the ferromagnetic film ($\delta_{FM}$) for Ta(2)/Ru(2)/Co—Hf/Ru(2)/Ta(2) and Ta(2)/Ru(2)/Ni—Fe/Ru/Ta (2) films. $M_S$ values, determined from slopes of $m_S$ versus $\delta_{FM}$ linear lines, are 490 and 809 emu/cm³ for the Co—Hf and Ni—Fe films, respectively. The Ni—Fe shielding layer 416 thus exhibits permeability higher by 4.1~10.7 times than the Co—Hf buffer layer 316.

Second, the incorporation of the Ni—Fe shielding layer 416 in the integrated auxiliary ferromagnetic shield 450 of the read head 400 leads to a much narrower read gap. In general, the lower bound of the read gap 340 is defined by an interface between the Co—Hf buffer layer 316 and the Ru seed layer 218 in the read head 300, while the lower bound of the read gap 440 is defined by an interface between the Ni—Fe shielding layer 416 and the Ru decoupling layer 418 in the read head 400. In fact, the lower bound of the read gap is lower and thus the read gap is wider, since a transition layer formed due to moment losses at the interface must be taken into account. As shown in FIG. 5, the $m_S$ versus $\delta_{FM}$ linear lines for the Ta/Ru/Co—Hf/Ru/Ta and Ta/Ru/Ni—Fe/Ru/Ta films are intercepted at 0.8 and 0.6 nm, respectively. By assuming that the moment losses are identical at lower and upper interfaces, transition layers at interfaces of the Co—Hf buffer layer 316 and the Ni—Fe shielding layer 416 are calculated to be 0.4 and 0.3 nm, respectively. Since Hf atoms diffuse more deeply and cause wider composition gradients, the transition layer with $M_S$ of below 200 emu/cm³ at the interface of the Co—Hf buffer layer 316 is expected to be much wider than that at the Ni—Fe shielding layer 416. After this read gap adjustment, the read gap of the read head 400 is expected to be much narrower that of the read head 300.

Third, the Ru parallel-coupling layer 414 also acts a seed layer to facilitate the Ni—Fe shielding layer 416 to develop a strong <111> crystalline texture, thereby facilitating the read sensor 401 to exhibit high pinning properties. Although a different seed layer formed of nonmagnetic Ta, Ti, W, Ir or Rh film may also work well to achieve high pinning properties, the Ru parallel-coupling layer 414 appears to be the best choice as described below. The Ru parallel-coupling layer 414 causes antiparallel coupling between the Co—Hf buffer layer 316 and the Ni—Fe shielding layer 416 when its thickness ranges from ~0.3 to ~0.5 nm, from ~0.6 to ~1.0 nm, or from ~1.5 to ~2.1 nm, but causes parallel coupling between the Co—Hf buffer layer 316 and the Ni—Fe shielding layer 416 when its thickness ranges from ~1.0 to ~1.5 nm. The Ru parallel-coupling layer 414 is thick enough to also act as a viable seed layer, and the parallel coupling is strong enough to ensure the formation of the integrated auxiliary ferromagnetic shield 450. On the other hand, decoupling will occur when the Ta, Ti or W seed layer is thick enough to act as a viable seed layer, while parallel coupling will occur but it is too weak to ensures the formation of the integrated auxiliary ferromagnetic shield 450 when the Ir or Rh seed layer is thick enough to act as a viable seed layer. Therefore, only the Ru parallel-coupling layer 414 is recommended in the invention.

Fourth, in-situ depositions of the buffer, parallel-coupling, shielding, decoupling and pinning layers at high temperatures facilitates the read sensor 401 to exhibit high pinning and thermal properties. The in-situ deposition is strictly defined as a deposition on a wafer with a film surface not exposed to low vacuum ($\geq 1\times 10^{-8}$ torr) in a transfer module, instead of to air.

The non-interrupted epitaxial growth of continuously deposited films in high vacuum ($\leq 1\times 10^{-8}$ torr) during the in-situ depositions facilitates the integrated auxiliary ferromagnetic shield 450 and the Ir—Mn pinning layer 220 to develop strong <111> crystalline textures, thereby facilitating the read sensor 401 to exhibit high pinning properties. The coalescence and enlargement of polycrystalline grains in films deposited at high temperatures also facilitates the integrated auxiliary ferromagnetic shield 450 and the Ir—Mn pinning layer 220 to develop strong <111> crystalline textures, thereby facilitating the read sensor 401 to exhibit high pinning and thermal properties.

In the fabrication process of the TMR read sensor 401, after heating a wafer with the lower ferromagnetic shield 206 formed of a 1 µm thick ferromagnetic 80Ni-20Fe film for 800 seconds at 350° C. in a first deposition module of a sputtering system, the buffer layer 316 formed of a 4 nm thick amorphous ferromagnetic 78.5Co-21.5Hf film, the parallel coupling layer 414 formed of a 1.2 nm thick nonmagnetic Ru film, the shielding layer 416 formed of a 12 nm thick ferromagnetic 80Ni-20Fe film, the decoupling layer 418 formed of a 1.2 nm thick nonmagnetic Ru film, and the pinning layer 220 formed of a 6 nm thick antiferromagnetic 23.2Ir-76.8Mn film are sequentially deposited on the wafer at 350° C. in the same deposition module.

After transferring the wafer to a second deposition module and cooling for 1,600 seconds, the keeper layer 222 formed of a 2 nm thick ferromagnetic 72.5Co-27.5Fe film, the antiparallel-coupling layer 226 formed of a 0.8 nm thick nonmagnetic Ru film, the first reference layer formed of a 0.4 nm thick ferromagnetic Co film, the second reference layer formed of a 0.6 nm thick ferromagnetic 42.8Co-37.8Fe-13.2B-6.2Ta film, the third reference layer formed of a 0.6 nm thick ferromagnetic 65.5Co-19.9Fe-14.6B film, and the fourth reference layer formed of a 0.4 nm thick ferromagnetic 46.8Co-53.2 Fe film are sequentially deposited on the wafer in the same deposition module.

After transferring the wafer to a third deposition module and coating the inner wall of the third deposition module with a 16 nm thick nonmagnetic Ti film, the barrier layer 210 is fabricated by alternatively depositing a 0.2 nm thick Mg film in an argon gas of $3\times 10^4$ torr at a target power of 40 W and exposing it in an oxygen gas of $1\times 10^{-5}$ for 60 minutes four times in the same module.

After transferring the wafer to a fourth deposition module and cooling for 800 seconds, the first sense layer formed of a 0.6 nm thick ferromagnetic 46.8Co-53.2Fe film, the second sense layer formed of a 1.6 nm thick ferromagnetic 79.3Co-4.0Fe-16.7B film, the third sense layer formed of a 1.6 nm thick ferromagnetic 77.4Co-1.2Fe-6.7B-14.7Hf film, the fourth sense layer formed of a 4.8 nm thick ferromagnetic Ni film, and the first cap layer formed of a 1 nm thick nonmagnetic Ru film are sequentially deposited on the wafer in the same deposition module.

After transferring the wafer to a fifth deposition module, the second cap layer formed of a 1 nm thick nonmagnetic Ta film and a third cap layer formed of a 4 nm thick nonmagnetic Ru film are sequentially deposited on the wafer in the same deposition module. The wafer is then annealed with a magnetic field of 50,000 Oe for 5 hours at 280° C. in a high-vacuum oven.

The wafer is loaded into a magneto-optical Kerr effect (MOKE) system and a laser beam is used to detect magnetic responses of the TMR read sensors 201, 301, 401. The laser beam is sensitive enough to detect entire magnetic moments of the sense layer structure 228, the reference layer structure 224 and the keeper layer structure 222, and the partial magnetic moment of the lower ferromagnetic shield 206, the buffer layer 316 or the shielding layer 416.

Figure 6:
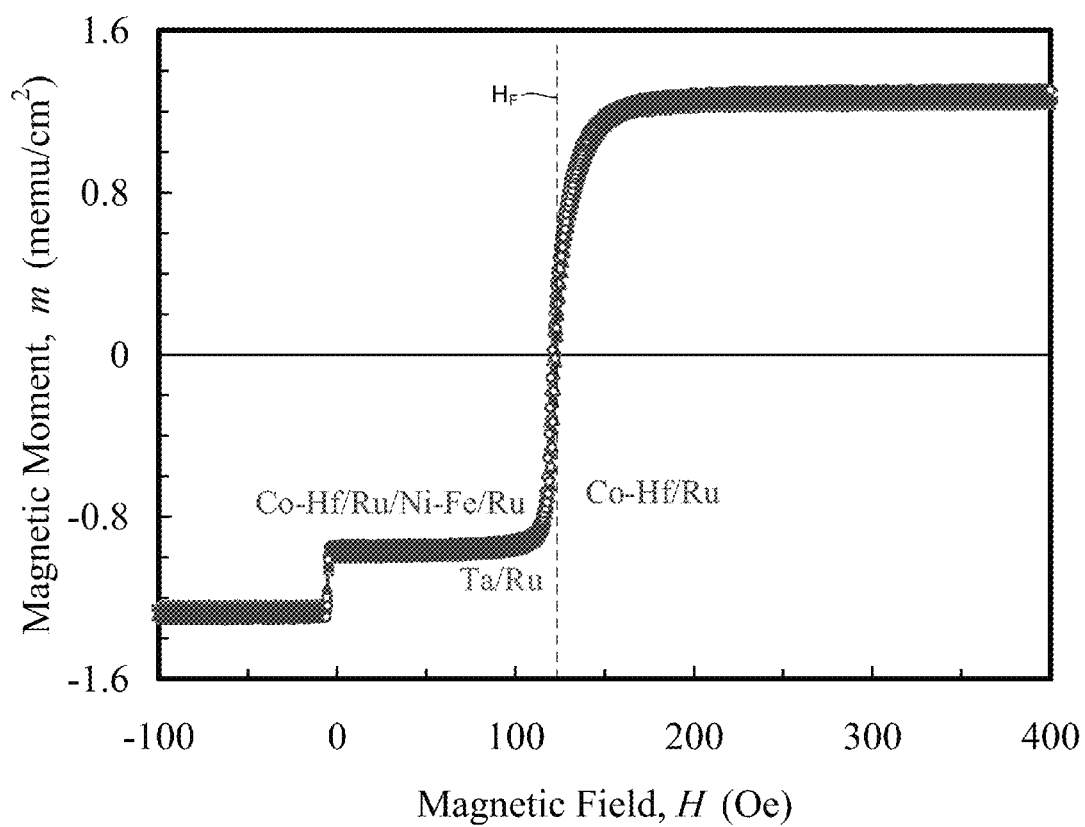
FIG. 6 is a chart showing low-field easy-axis magnetic responses of TMR read sensors 201, 301, 401.

FIG. 6 shows low-field easy-axis magnetic responses of the TMR read sensors 201, 301, 401. $H_F$ remains nearly unchanged at ~120 Oe in spite of concerns of surface roughness induced by the integrated auxiliary ferromagnetic shield 450. It is believed that the high-temperature depositions of the buffer layer 316, the parallel coupling layer 414, the shielding layer 416, the decoupling layer 418 and the pinning layer 220 play a crucial role in ensuring a smooth surface.

Figure 7:
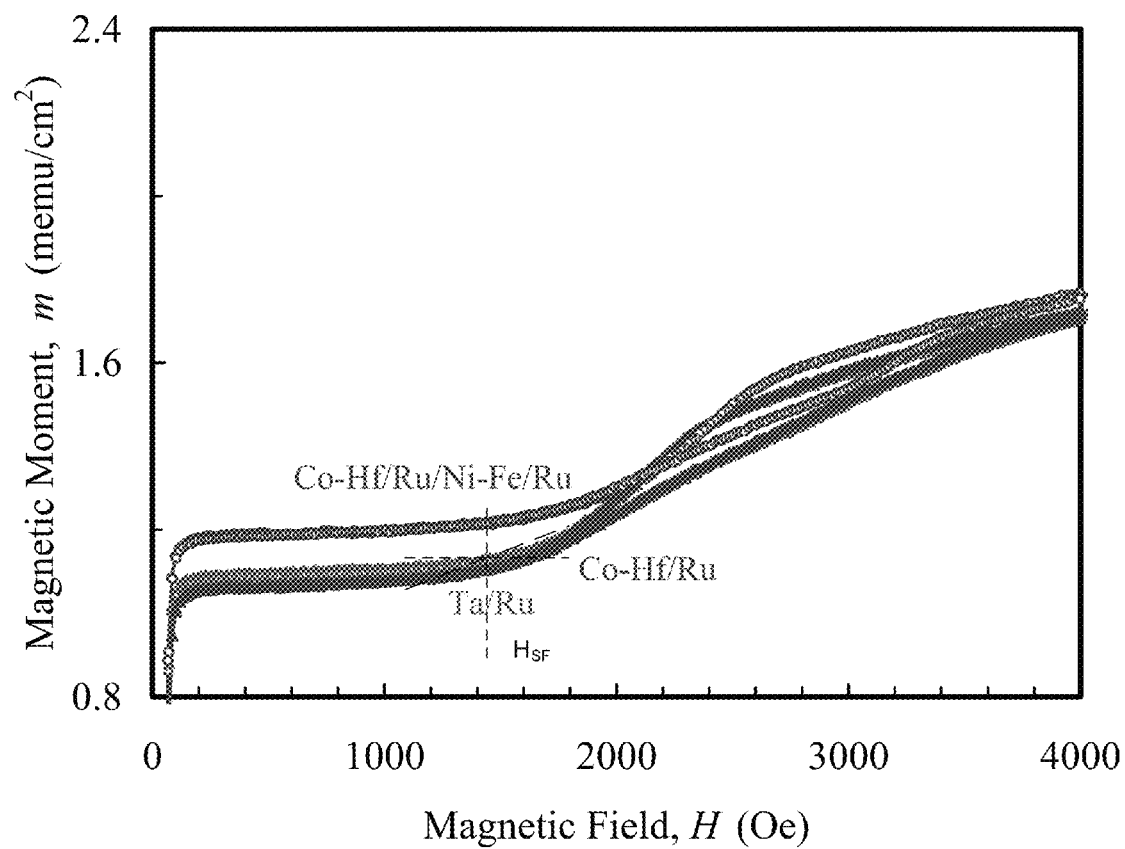
FIG. 7 is a chart showing high-field easy-axis magnetic responses of TMR read sensors 201, 301, 401.

FIG. 7 shows high-field easy-axis magnetic responses of the TMR read sensors 201, 301, 401. The magnetizations of the reference layer structure 224 in the TMR read sensors 201, 301 401 start to rotate at spin-flop fields ($H_{SF}$) of 1,502, 1,470 and 1,692 Oe, respectively, indicating that the use of the integrated auxiliary ferromagnetic shield 450 leads to the highest pinning properties. It is thus confirmed that the Ru parallel-coupling layer 414 facilitates the Ni—Fe shielding layer 416 to develop a strong <111> crystalline texture, thereby facilitating the read sensor 401 to exhibit high pinning properties.

After coating with a top conducting lead comprising nonmagnetic Cu(75)/Ru(12) films in selected areas, the wafer is probed with a 12-point microprobe in a magnetic field of ~160 Oe. Measured data from any four of the microprobe are analyzed with a current-in-plane tunneling model to determine $R_JA_J$, $\Delta R_T/R_J$ and FoM. The TMR read sensors 201, 301, 401 exhibit $R_JA_J$ values of 0.64, 0.64 and 0.63 $\Omega$-$\mu m^2$, respectively, $\Delta R_T/R_J$ values of 87.2, 85.3 and 85.2%, respectively, and FoM values of 135.7, 136.8 and 134.2, respectively. The TMR read sensors 201, 301, 401 thus exhibit comparable TMR properties.

An advantage of the invention is that the use of the integrated auxiliary ferromagnetic shield 450 leads to unexpected high thermal properties. To evaluate the thermal properties, the TMR read sensors 201, 301, 401 are deposited on Si wafers coated with ~1,000 nm thick $SiO_2$ films, and then annealed with a magnetic field of 50,000 Oe for 5 hours at 280° C. in a high-vacuum oven. After cooling in the high-vacuum oven and in air, the wafers are cut into 5 mm×10 mm samples, and each sample is baked with a magnetic field of 16,000 Oe along a baking direction antiparallel to the annealing direction for 5 minutes at incrementally increasing baking temperatures ($T_B$) in a tube oven. The tube oven provides a hot environment similar to that in a disk drive where the TMR read sensors 201, 301, 401 operate. During baking at incrementally increasing $T_B$, thermal energies are accumulated to deteriorate the rigidity of the keeper layer 222 and tilt its magnetization ($M_1$) by a tilting angle ($\theta_T$). Simultaneously, the magnetization of the reference layer structure 224 ($M_2$) and that of the sense layer structure 228 ($M_3$) will also be tilted by $-\theta_T$, due to antiparallel coupling across the spacer layer 226 and parallel coupling across the barrier layer 210, respectively. Baking thus induces identical $M_1$, $M_2$ and $M_3$ tilting behaviors.

After cooling from each $T_B$ to 30° C. in the tube oven, the sample is probed with a four-point probe. Electrical responses are detected while applying a sense current ($I_S$) to the sample in a direction perpendicular to the annealing direction and applying an external field ($H_{EX}$) of below 200 Oe to the sample in a directions parallel or antiparallel to the annealing direction. $H_{EX}$ is so low that it will only rotate $M_3$ from $-\theta_T$, while $M_1$ and $M_2$ remain intact at $\theta_T$ and $-\theta_T$, respectively. By simply characterizing the $M_3$ tilting behavior, the $M_1$ and $M_2$ tilting behaviors, which are correlated with the rigidity of the keeper layer 222 and the reference layer structure 224, respectively, can be investigated, and thus the thermal properties of the TMR read sensors 201, 301, 401 can be evaluated.

Figure 8:
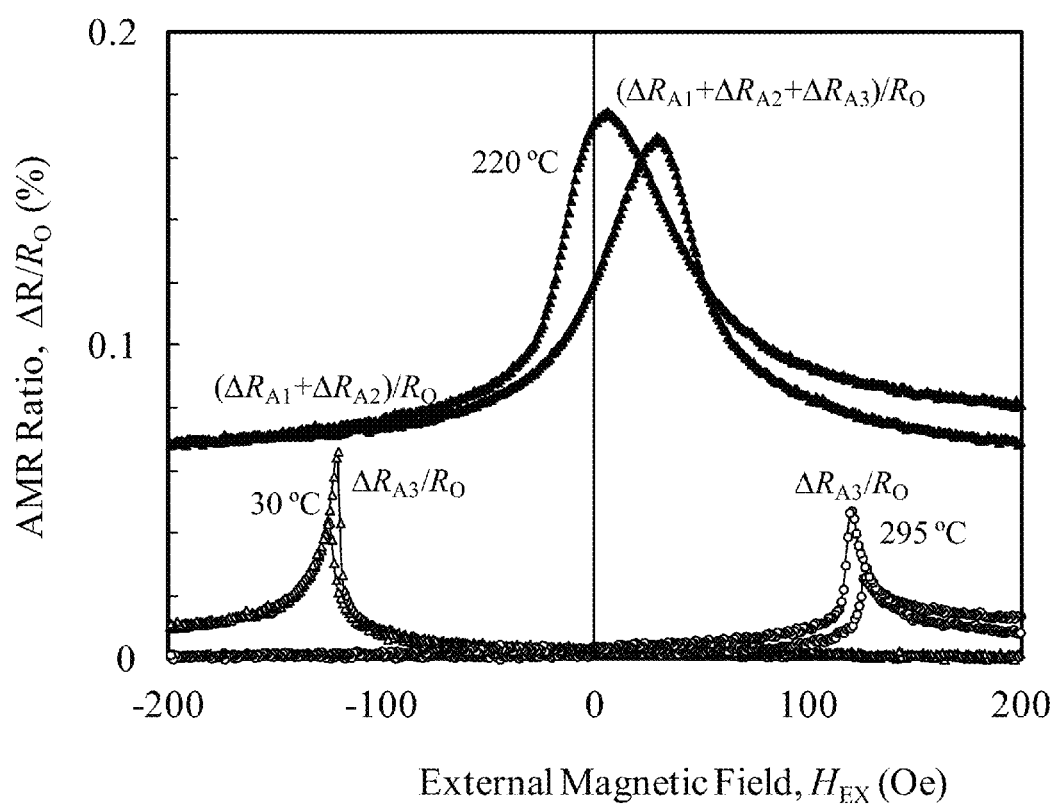
FIG. 8 is a chart showing low-field electrical responses of a TMR read sensor 201 after baking at 30, 220 and 295° C.

FIG. 8 shows low-field electrical responses of the TMR read sensor 201 after baking at 30, 220 and 295° C. The low-field electrical responses after each baking temperature reveal two anisotropic magnetoresistance (AMR) peaks. After baking at 30° C., $M_1$, $M_2$ and $M_3$ remain intact, and are all perpendicular to $I_S$. The resistance of the TMR read sensor 201 ($R_S$) thus exhibits the lowest value ($R_O$). As $H_{EX}$ parallel to the annealing direction increases at $H_F$ of 121.2 Oe, it rotates $M_3$ by 180° into the annealing direction, while $M_1$ and $M_2$ remain intact. Since this $M_3$ rotation induces an AMR effect, $R_S$ increases from $R_O$ when $M_3$ is perpendicular to $I_S$, to $R_O+\Delta R_{43}$ (where $\Delta R_{43}$ is the highest AMR of the sense layer structure 228) when $M_3$ is parallel to $I_S$, and then to $R_O$ again when $M_3$ is perpendicular to $I_S$ again. A ratio of $\Delta R_S/R_O$ thus reaches the highest value of $\Delta R_{43}/R_O$ (defined as an AMR coefficient of the sense layer structure 228) and an AMR peak appears at $H_F$. As $H_{EX}$ parallel to the annealing direction decreases at $H_F$ of 124.6 Oe, $M_3$ becomes free and rotates by $-180°$ to its original direction, while $M_1$ and $M_2$ remain intact. Since this $M_3$ rotation induces another AMR effect, $R_S$ increases from Ro when $M_3$ is perpendicular to $I_S$, to $R_O+\Delta R_{43}$ when $M_3$ is parallel to $I_S$, and then to $R_O$ again when $M_3$ is perpendicular to $I_S$ again. The ratio of $\Delta R_S/R_O$ thus reaches the highest value of $\Delta R_{43}/R_O$ again and another AMR peak appears at $H_F$.

After baking at 220° C., $M_1$ is tilted by ~90° towards a direction nearly perpendicular to the annealing direction (or nearly parallel to $I_S$), while $M_2$ and $M_3$ are also tilted simultaneously by ~90° towards another direction nearly perpendicular to the annealing direction (or nearly antiparallel to $I_S$), due to antiparallel coupling across the spacer layer 226 and parallel coupling across the barrier layer 210, respectively. Due to three AMR effects, $R_S$ approaches its highest value, $R_O+\Delta R_{41}+\Delta R_{42}+\Delta R_{43}$, where $\Delta R_{41}$ and $\Delta R_{42}$ are maximal AMR values of the keeper layer 222 and the reference layer structure 224, respectively. As $H_{EX}$ antiparallel to the annealing direction increases at $h_f$ (which is the component of $H_F$) of 28.7 Oe or decreases at $h_f$ of 5.5 Oe, it rotates $M_3$ into the $H_{EX}$ direction, while $M_1$ and $M_2$ remain intact. Since this $M_3$ rotation induces the AMR effect, $R_S$ decreases by $\Delta R_{43}$. A tilting temperature ($T_T$) is defined as a critical $T_B$ which tilts $M_1$ by 90° into a direction exactly perpendicular to the annealing direction, and also tilts $M_2$ and $M_3$ simultaneously by 90° into another direction exactly perpendicular to the annealing direction. As shown in FIG. 8, $T_T$ is determined to be ~220° C.

After baking at 295° C., $M_1$ is tilted by ~180° towards a direction antiparallel to the annealing direction, while $M_2$ and $M_3$ are also tilted simultaneously by ~180° towards a direction parallel to the annealing direction, due to antiparallel coupling across the spacer layer 226 and parallel coupling across the barrier layer 210, respectively. Since both directions are nearly perpendicular to $I_S$, $R_S$ is nearly equal to $R_O$. As $H_{EX}$ antiparallel to the annealing direction increases at $h_f$ of 126.4 Oe (which is slightly higher than $H_F$ before baking, indicating that $H_F$ might slightly increase after baking) or decreases at $h_f$ of 120.1 Oe, it rotates $M_3$ by ~180° into the $H_{EX}$ direction, while $M_1$ and $M_2$ remain intact. Since this $M_3$ rotation induces the AMR effect, $R_S$ increases by $\Delta R_{A3}$. A saturation temperature ($T_S$) is defined as a critical $T_B$ which tilts $M_1$ by 180° into a direction exactly antiparallel to the annealing direction, and also tilts $M_2$ and $M_3$ simultaneously by 180° into a direction exactly parallel to the annealing direction. As shown in FIG. 8, $T_S$ is determined to be ~295° C.

Figure 9:
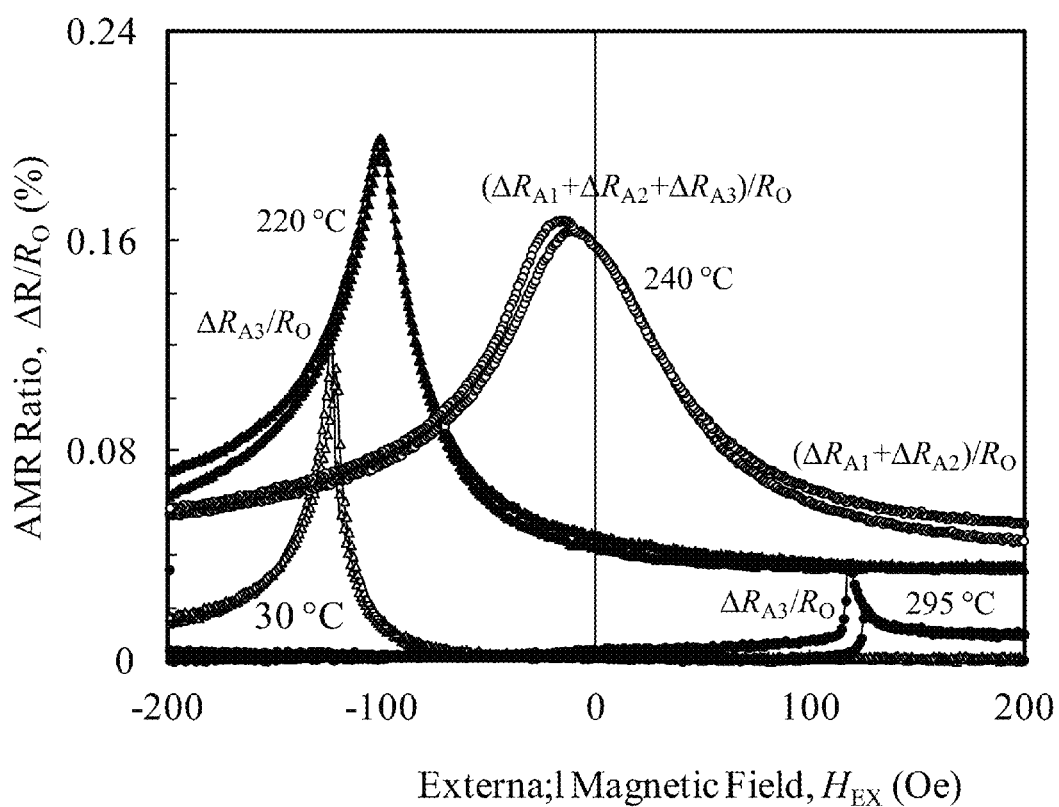
FIG. 9 is a chart showing low-field electrical responses of a TMR read sensor 301 after baking at 30, 220, 240 and 295° C.

FIG. 9 shows low-field electrical responses of the TMR read sensor 301 after baking at 30, 220, 240 and 295° C. Since the Co—Hf buffer layer 316 does not exhibit the AMR effect, its incorporation into the TMR read sensor 301 does not cause any difficulties in investigating the $M_3$ tilting behavior and in evaluating the thermal properties of the TMR read sensor 301. Baking at 220° C. causes the two AMR peaks to move from its original location at −122.4 Oe to a nearby location at −100.8 Oe, while baking at 240° C. causes the two AMR peaks to move to a location at −13.4 Oe. As shown in FIG. 9, $T_T$ is determined to be ~240° C., indicating that the replacement of the Ta buffer layer 216 with the Co—Hf buffer layer 316 leads to a higher thermal stability.

Figure 10:
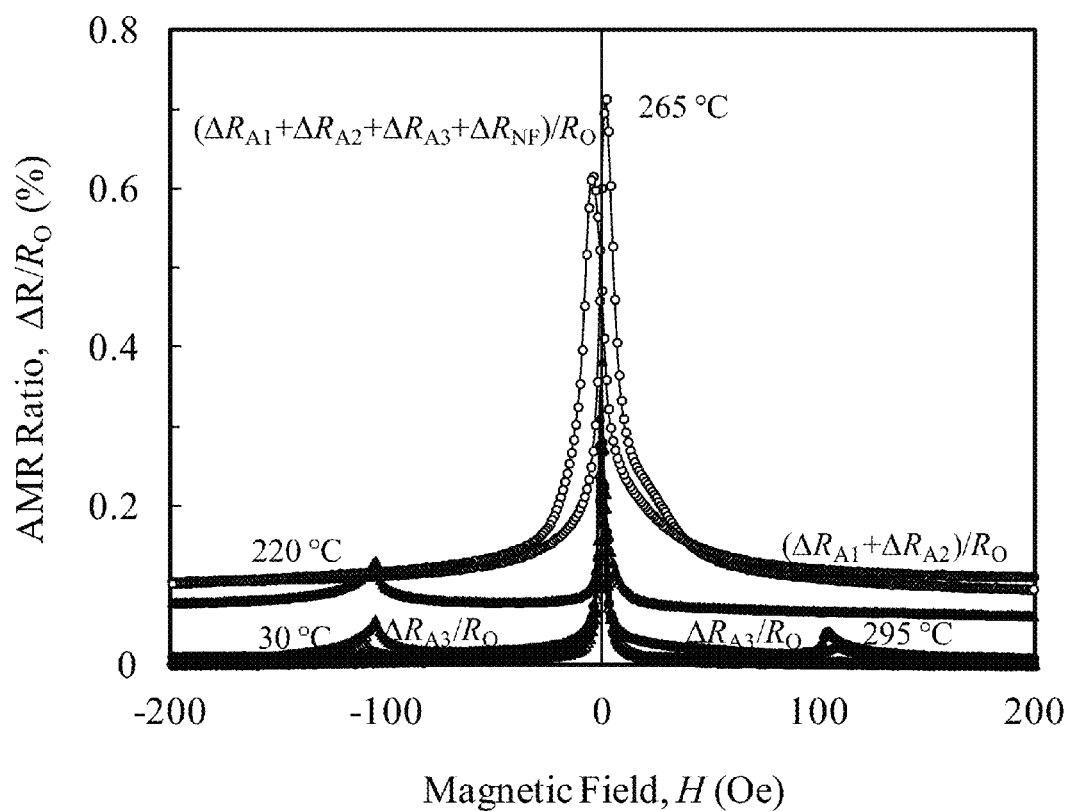
FIG. 10 is a chart showing low-field electrical responses of a TMR read sensor 401 after baking at 30, 220, 265 and 295° C.

FIG. 10 shows low-field electrical responses of the TMR read sensor 401 after baking at 30, 220, 265 and 295° C. Since the Ni—Fe shielding layer 416 exhibits a large AMR effect, two tall AMR peaks with a height of $\Delta R_{NF}/R_O$ (defined as an AMR coefficient of the Ni—Fe shielding layer 416) appear at ~0 Oe before baking and remains fixed after baking at various temperatures. After baking at temperatures of around $T_T$, the two short AMR peaks as preciously described will move towards and overlap with the two tall AMR peaks. The peak overlapping might cause difficulties in investigating the $M_3$ tilting behavior and in evaluating the thermal properties of the TMR read sensor 401. In fact, the investigation and evaluation are still viable by finding overlapped peaks with the maximal height of $R_O + \Delta R_{A1} + \Delta R_{A2} + \Delta R_{A3} + \Delta R_{NF}$. As shown in FIG. 10, $T_T$ is determined to be ~265° C., indicating that the use of the integrated auxiliary shield 450 leads to the highest thermal stability.

Figure 11:
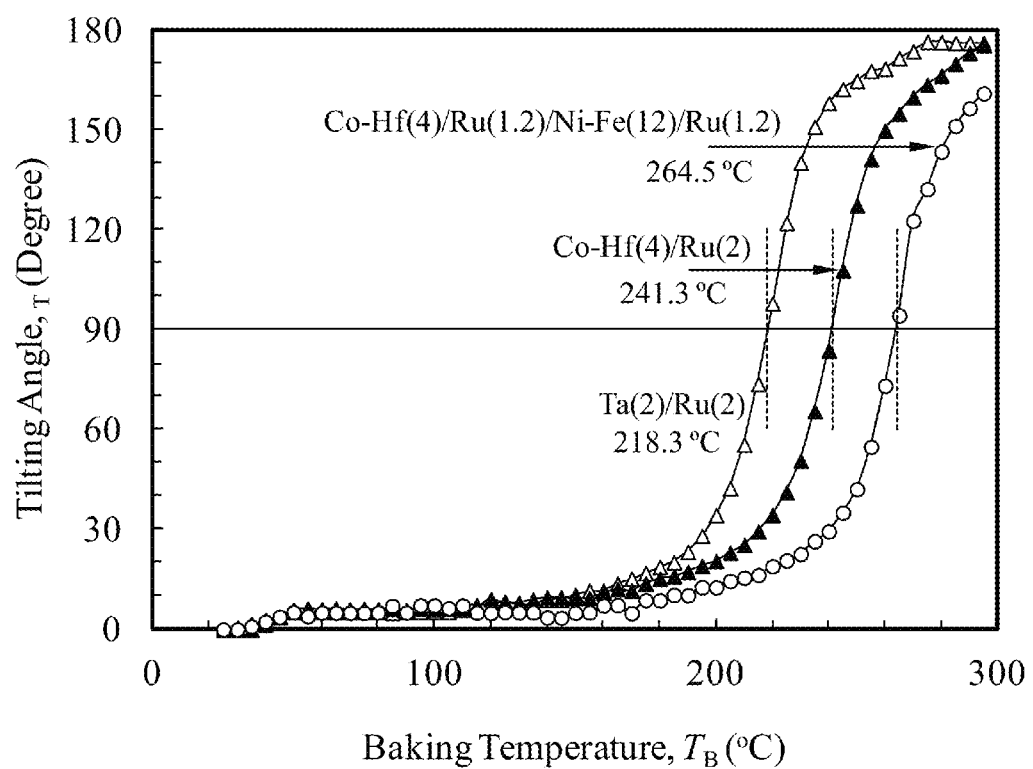
FIG. 11 is a chart showing $\theta_T$ versus $T_B$ for TMR read sensors 201, 301, 401 after baking at incrementally increasing $T_B$.

FIG. 11 shows $\theta_T$ versus $T_B$ for the TMR read sensors 201, 301, 401 after baking at incrementally increasing $T_B$. $\theta_T$ is determined by cos ($h_f/H_F$). After baking at incrementally increasing $T_B$, $\theta_T$ gradually increases from 0 to 90° and beyond. $T_T$ values, determined at $\theta_T$=90°, are 218.3, 241.3 and 264.5° C. for the TMR read sensors 201, 301, 401, respectively. Therefore, the replacement of the buffer layer 216 and the seed layer 218 with the integrated auxiliary ferromagnetic shield 450 causes an increase in $T_T$ by as high as 46.2° C.

Table 1 lists $H_F$, $H_{SF}$, $R_J A_J$, $\Delta R_J/R_J$, FoM and $T_T$ for the TMR read sensors 201, 301, 401. In summary, after the replacement of the buffer layer 216 and the seed layer 218 with the integrated auxiliary ferromagnetic shield 450, $H_F$, $R_J A_J$, $\Delta R_J/R_J$ and FoM remain nearly unchanged, while $H_{SF}$ and $T_T$ substantially increase.

TABLE 1

| Ta (nm) | Co—Hf (nm) | Ru (nm) | Ni—Fe (nm) | Ru (nm) | $H_F$ (Oe) | $H_{SF}$ (Oe) | $R_J A_J$ ($\Omega$-$\mu m^2$) | $\Delta R_T/R_J$ (%) | FoM | $T_T$ (° C.) |
|---|---|---|---|---|---|---|---|---|---|---|
| 2 | 0 | 0 | 0 | 2 | 120.4 | 1,502 | 0.64 | 87.2 | 135.7 | 218.3 |
| 0 | 4 | 0 | 0 | 2 | 122.7 | 1,470 | 0.64 | 85.3 | 136.8 | 241.3 |
| 0 | 4 | 1.2 | 12 | 1.2 | 121.5 | 1,692 | 0.63 | 85.2 | 134.2 | 264.5 |

Figure 12:
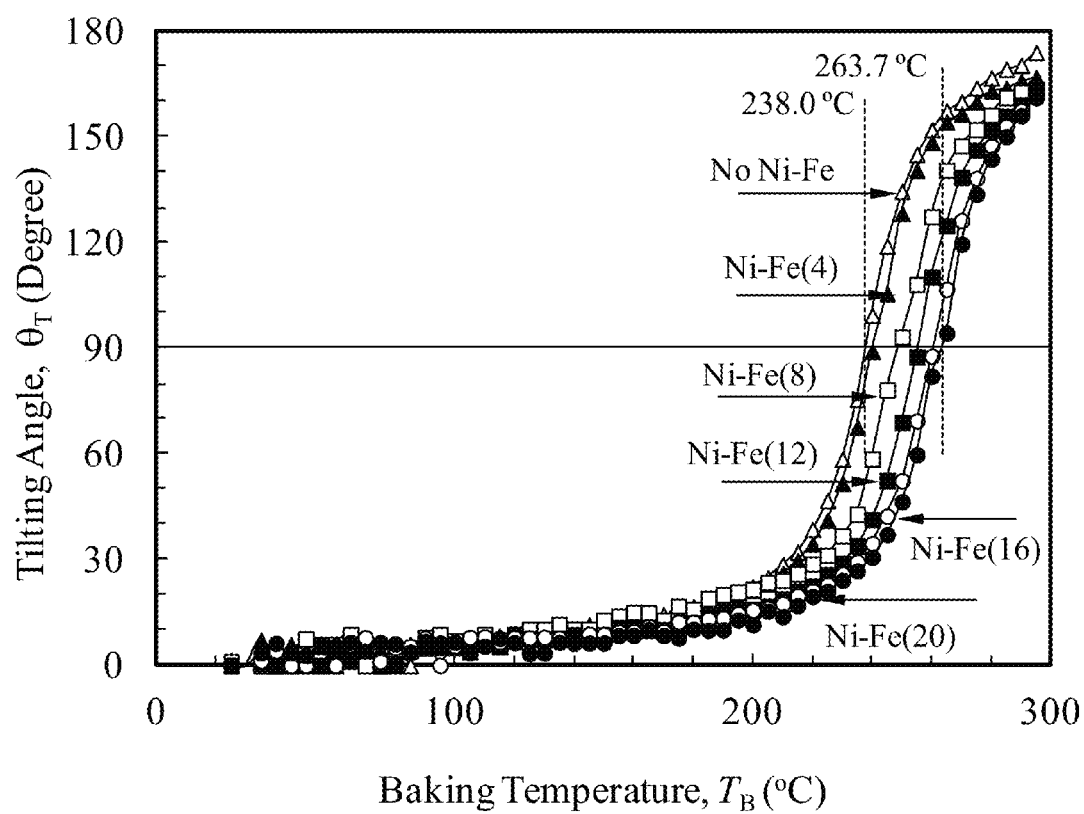
FIG. 12 is a chart showing $\theta_T$ versus $T_B$ for various TMR read sensors 401 with Ni—Fe shielding layers of various thicknesses after baking at incrementally increasing $T_B$.

FIG. 12 shows $\theta_T$ versus $T_B$ for the TMR read sensors 401 with the Ni—Fe shielding layers 416 of various thicknesses after baking at incrementally increasing $T_B$. As the thickness of the Ni—Fe shielding layer 416 ($\delta_{NF}$) increases from zero to 4, 8, 12, 16 and 20 nm, $T_T$ increases from 238.0° C. to 241.0, 249.4, 264.5, 265.5 and 269.0° C., respectively. Therefore, $T_T$ increases as $\delta_{NF}$ increases with a rate of 2.21° C./nm when $\delta_{NF}$ is below 12 nm, and then with a rate of 0.56° C./nm when $\delta_{NF}$ is above 12 nm.

Figure 13:
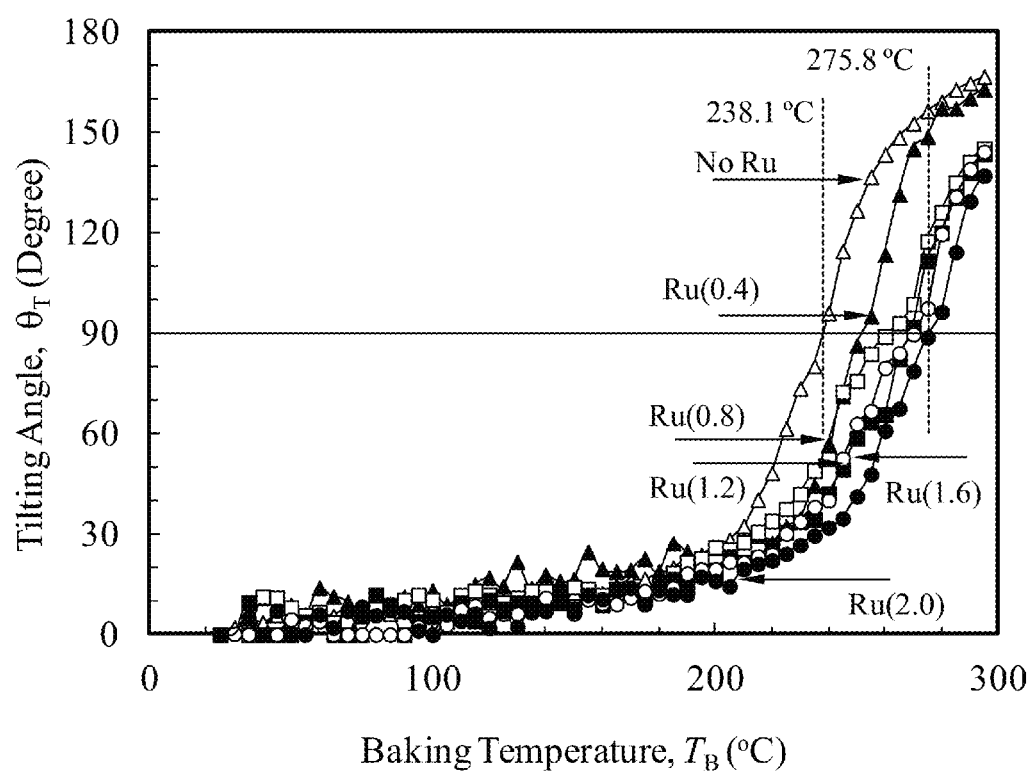
FIG. 13 is a chart showing $\theta_T$ versus $T_B$ for various TMR read sensors 401 with Ru decoupling layers of various thicknesses after baking at incrementally increasing $T_B$.

FIG. 13 shows $\theta_T$ versus $T_B$ for the TMR read sensors 401 with the Ru decoupling layers 418 of various thicknesses after baking at incrementally increasing $T_B$. As the thickness of the Ru decoupling layer 418 ($\delta_{Ru}$) increases from zero to 0.4, 0.8, 1.2, 1.6 and 2 nm, $T_T$ increases from 238.1° C. to 252.1, 259.2, 269.0, 270.3 and 275.8° C., respectively. Therefore, $T_T$ increases as $\delta_{Ru}$ increases with a rate of 35° C./nm when $\delta_{Ru}$ is below 0.4 nm, and then with a rate of 14.8° C./nm when $\delta_{Ru}$ is above 0.4 nm.

Figure 14:
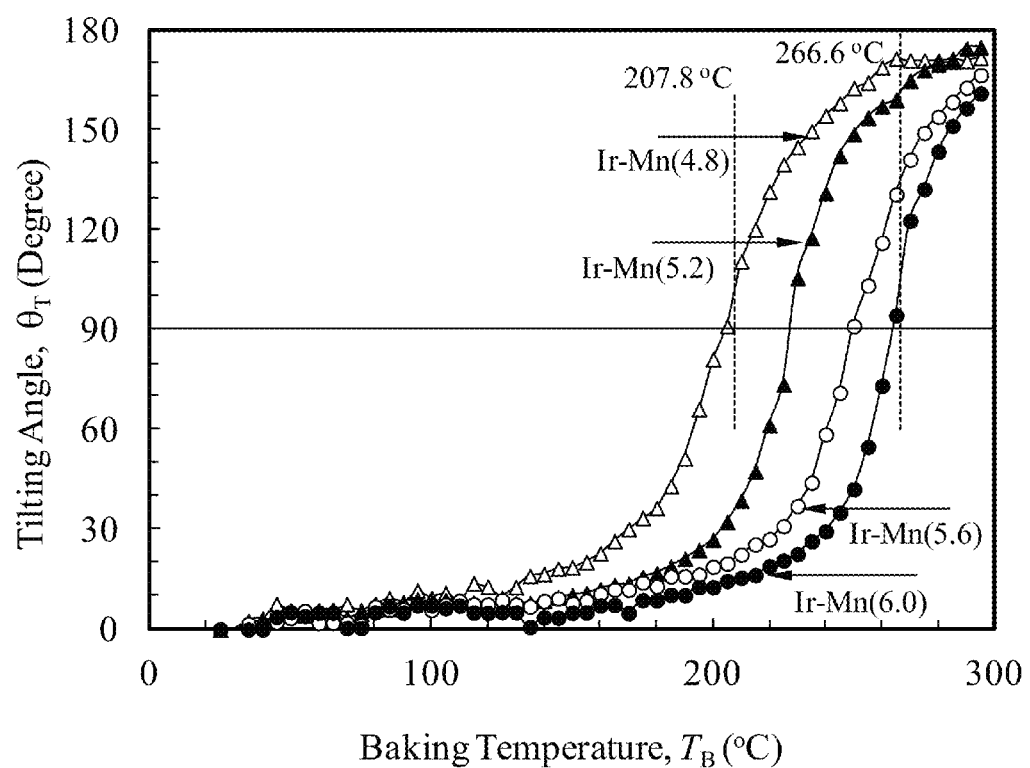
FIG. 14 is a chart showing $\theta_T$ versus $T_B$ for various TMR read sensors 401 with Ir—Mn pinning layers of various thicknesses after baking at incrementally increasing $T_B$.

FIG. 14 shows $\theta_T$ versus $T_B$ for the TMR read sensors 401 with the Ir—Mn pinning layers 220 of various thicknesses after baking at incrementally increasing $T_B$. As the thickness of the Ir—Mn pinning layer 220 ($\delta_{IM}$) increases from 4.8 to 5.2, 5.6 and 6 nm, $T_T$ increases from 207.8° C. to 227.6, 251.8 and 269.0° C., respectively. Therefore, $T_T$ increases as $\delta_{IM}$ increases with a rate of 51° C./nm.

Table 2 lists $R_J A_J$, $\Delta R_T/R_J$, FoM and $T_T$ for TMR read sensors 401 with the Ni—Fe shielding layers 416, the Ru decoupling layers 418 and the Ir—Mn pinning layers 220 of various thicknesses. In summary, to exhibit high $\Delta R_T/R_J$, FoM and $T_T$ at $R_J A_J$ of ~0.6 $\Omega$-$\mu m^2$, the Ni—Fe shielding layer 416 is preferably thicker than 8 nm, and the Ru decoupling layer 418 is preferably thicker than 0.4 nm. In addition, the Ir—Mn pinning layer 220 can be as thin as 4.8 nm for further reducing the read gap, while still exhibiting $T_T$ as high as 207.8° C.

TABLE 2

| Co—Hf (nm) | Ru (nm) | Ni—Fe (nm) | Ru (nm) | Ir—Mn (nm) | $R_J A_J$ ($\Omega$-$\mu m^2$) | $\Delta R_T/R_J$ (%) | FoM | $T_T$ (° C.) |
|---|---|---|---|---|---|---|---|---|
| 4 | 1.2 | 0 | 1.2 | 6 | 0.63 | 86.3 | 137.2 | 238.0 |
| 4 | 1.2 | 4 | 1.2 | 6 | 0.63 | 76.7 | 121.3 | 241.0 |
| 4 | 1.2 | 8 | 1.2 | 6 | 0.63 | 86.5 | 136.8 | 249.4 |
| 4 | 1.2 | 12 | 1.2 | 6 | 0.65 | 85.2 | 134.2 | 264.5 |
| 4 | 1.2 | 16 | 1.2 | 6 | 0.63 | 86.9 | 137.8 | 265.5 |
| 4 | 1.2 | 20 | 1.2 | 6 | 0.63 | 86.4 | 137.4 | 269.0 |
| 4 | 1.2 | 20 | 0 | 6 | 0.62 | 85.9 | 137.8 | 238.1 |
| 4 | 1.2 | 20 | 0.4 | 6 | 0.64 | 86.0 | 135.2 | 252.1 |
| 4 | 1.2 | 20 | 0.8 | 6 | 0.63 | 85.1 | 135.2 | 259.2 |
| 4 | 1.2 | 20 | 1.2 | 6 | 0.64 | 87.4 | 137.4 | 269.0 |
| 4 | 1.2 | 20 | 1.6 | 6 | 0.63 | 85.2 | 135.2 | 270.3 |
| 4 | 1.2 | 20 | 2 | 6 | 0.63 | 87.0 | 139.1 | 275.8 |
| 4 | 1.2 | 20 | 1.2 | 4.8 | 0.64 | 88.2 | 135.7 | 207.8 |
| 4 | 1.2 | 20 | 1.2 | 5.2 | 0.63 | 87.7 | 136.8 | 227.6 |
| 4 | 1.2 | 20 | 1.2 | 5.6 | 0.61 | 86.8 | 134.2 | 251.8 |
| 4 | 1.2 | 20 | 1.2 | 6 | 0.64 | 87.4 | 137.4 | 269.0 |

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A read sensor, comprising:
a barrier layer sandwiched between lower and upper sensor stacks;
the lower sensor stack comprising:
an integrated auxiliary shield;
a pinning layer on the integrated auxiliary shield;
a keeper layer on the pinning layer;
an antiparallel coupling layer on the keeper layer; and
a reference layer structure on the antiparaliel coupling layer;
the upper sensor stack comprising:
a sense layer structure on the barrier layer; and
a cap layer structure on the sense layer structure.

2. The read sensor as in claim 1, wherein the integrated auxiliary shield comprises:
a buffer layer on a lower ferromagnetic shield formed of a ferromagnetic Ni—Fe film;
a parallel-coupling layer on the buffer layer;
a shielding layer on the parallel-coupling layer; and
a decoupling layer on the shielding layer.

3. The read sensor as in claim 2, wherein the buffer layer contains Co with a content ranging from 70 to 94 at % and X with a content ranging from 6 to 30 at %, where X is Hf, Zr, Y or B, and has a thickness ranging from 0.6 to 4 nm.

4. The read sensor as in claim 2, wherein the parallel-coupling layer contains Ru, and has a thickness ranging from 1 to 1.8 nm.

5. The read sensor as in claim 2, wherein the shielding layer contains Ni with a content ranging from 70 to 90 at % and Fe with a content ranging from 10 to 30 at %, and has a thickness ranging from 4 to 20 nm.

6. The read sensor as in claim 2, wherein the decoupling layer contains Ru, and has a thickness ranging from 0.8 to 4 nm.

7. The read sensor as in claim 1, wherein the pinning layer contains Ir with a content ranging from 16 to 24 at % and Mn with a content ranging from 76 to 84 at %, and has a thickness ranging from 4 to 8 nm.

8. The read sensor as in claim 1, wherein the barrier layer contains several laminates of oxygen-doped Mg (Mg—O) films, each laminate being formed by depositing a nonmagnetic Mg film and exposing it in an oxygen gas.

9. A magnetic data recording device, comprising:
a housing;
a magnetic media mounted within the housing;
an actuator;
a slider connected with the actuator for movement adjacent to the magnetic media; and
a read sensor formed on the slider, the read sensor further comprising:
a barrier layer sandwiched between lower and upper sensor stacks;
the lower sensor stack comprising:
an integrated auxiliary shield;
a pinning layer on the integrated auxiliary shield;
a keeper layer on the pinning layer;
an antiparallel coupling layer on the keeper layer; and
a reference layer structure on the antiparallel coupling layer;
the upper sensor stack comprising:
a sense layer structure on the barrier layer; and
a cap layer structure on the sense layer structure.

10. The magnetic data recording device as in claim 9 wherein the integrated auxiliary shield comprises:
a buffer layer on a lower ferromagnetic shield formed of a ferromagnetic Ni—Fe film;
a parallel-coupling layer on the buffer layer;
a shielding layer on the parallel-coupling layer; and
a decoupling layer on the shielding layer.

11. The magnetic data recording device as in claim 10, wherein the buffer layer contains Co with a content ranging from 70 to 94 at % and X with a content ranging from 6 to 30 at %, where X is Hf, Zr, Y or B, and has a thickness ranging from 0.6 to 4 nm.

12. The magnetic data recording device as in claim 10, wherein the parallel-coupling layer contains Ru, and has a thickness ranging from 1 to 1.8 nm.

13. The magnetic data recording device as in claim 10, wherein the shielding layer contains Ni with a content ranging from 70 to 90 at, and Fe with a content ranging from 10 to 30 at %, and has a thickness ranging from 4 to 20 nm.

14. The magnetic data recording device as in claim 10, wherein the decoupling layer contains Ru, and has a thickness ranging from 0.8 to 4 nm.

15. The magnetic data recording device as in claim 9, wherein the pinning layer contains Ir with a content ranging from 16 to 24 at % and Mn with a content ranging from 76 to 84 at %, and has a thickness ranging from 4 to 8 nm.

16. The magnetic data recording device as in claim 9, wherein the barrier layer contains several laminates of oxygen-doped Mg (Mg—O) films, each laminate being formed by depositing a nonmagnetic Mg film and exposing it in an oxygen gas.

\* \* \* \* \*